(12) United States Patent  (10) Patent No.: US 8,018,001 B2
Otake  (45) Date of Patent: Sep. 13, 2011

(54) SEMICONDUCTOR DEVICE

(75) Inventor: Seiji Otake, Saitama (JP)

(73) Assignees: Semiconductor Components Industries, LLC, Phoenix, AZ (US); Sanyo Semiconductor Co., Ltd., Ora-gun (JP)

( * ) Notice: Subject to any disclaimer, the term of this patent is extended or adjusted under 35 U.S.C. 154(b) by 139 days.

(21) Appl. No.: 12/419,150

(22) Filed: Apr. 6, 2009

(65) Prior Publication Data

US 2009/0250759 A1  Oct. 8, 2009

(30) Foreign Application Priority Data

Apr. 8, 2008 (JP) ................................. 2008-099929

(51) Int. Cl.
*H01L 23/62* (2006.01)
(52) U.S. Cl. ......................... 257/356; 257/357; 438/284
(58) Field of Classification Search .......... 257/356–357, 257/E27.016; 438/284
See application file for complete search history.

(56) References Cited

U.S. PATENT DOCUMENTS

| 6,577,171 | B1 * | 6/2003 | Filippo et al. .................. 327/108 |
| 6,580,184 | B2 | 6/2003 | Song |
| 7,675,141 | B2 | 3/2010 | Otake |

FOREIGN PATENT DOCUMENTS

| CN | 101064304 | 10/2007 |
| JP | 6-151900 | 5/1994 |
| JP | 2002-84171 | 3/2002 |
| KR | 1992-0015648 | 8/1992 |
| KR | 2003-0008988 | 1/2003 |

\* cited by examiner

*Primary Examiner* — Theresa T Doan
(74) *Attorney, Agent, or Firm* — Morrison & Foerster LLP

(57) ABSTRACT

A breakdown voltage of a clamp diode can be reduced while a leakage current is suppressed. A P$^-$ type diffusion layer is formed in a surface of an N$^-$ type semiconductor layer. An N$^+$ type diffusion layer is formed in a surface of the P$^-$ type diffusion layer. A P$^+$ type diffusion layer is formed adjacent the N$^+$ type diffusion layer in the surface of the P$^-$ type diffusion layer. An N$^+$ type diffusion layer is formed adjacent the P$^-$ type diffusion layer in the surface of the N$^-$ type semiconductor layer. There is formed a cathode electrode, which is electrically connected with the N$^+$ type diffusion layer through a contact hole formed in an insulation film on the N$^+$ type diffusion layer. There is formed a wiring (an anode electrode) connecting between the P$^+$ type diffusion layer and the N$^+$ type diffusion layer through a contact hole formed in the insulation film on the P$^+$ type diffusion layer and a contact hole formed in the insulation film on the N$^+$ type diffusion layer.

4 Claims, 2 Drawing Sheets

US 8,018,001 B2

SEMICONDUCTOR DEVICE

CROSS-REFERENCE OF THE INVENTION

This application claims priority from Japanese Patent Application No. 2008-099929, the content of which is incorporated herein by reference in its entirety.

BACKGROUND OF THE INVENTION

1. Field of the Invention

This invention relates to a semiconductor device, specifically to a semiconductor device provided with a clamp diode.

2. Description of the Related Art

A Zener diode has been used as a diode to protect a gate insulation film of a MOS transistor by clamping a voltage applied between a drain (or a source) and a gate of the MOS transistor. A structure of the Zener diode is described referring to FIG. 4. As shown in the figure, an $N^-$ type semiconductor layer 51 is formed on a P type semiconductor substrate 50, and a $P^+$ type diffusion layer 52 is formed in a surface of the $N^-$ type semiconductor layer 51. Also, an $N^+$ type diffusion layer 53 is formed in a surface of the $P^+$ type diffusion layer 52.

An insulation film 54 is formed to cover the surface of the $N^-$ type semiconductor layer 51. There is formed a cathode electrode 55 connected with the $N^+$ type diffusion layer 53 through a contact hole that is formed in the insulation film 54 on the $N^+$ type diffusion layer 53. Also, there is formed an anode electrode 56 connected with the $P^+$ type diffusion layer 52 through a contact hole that is formed in the insulation film 54 on the $P^+$ type diffusion layer 52.

In a structure described above, the $N^+$ type diffusion layer 53 serves as a cathode, while the $P^+$ type diffusion layer 52 serves as an anode. When a reverse bias voltage is increasingly applied between the cathode electrode 55 and the anode electrode 56, there is caused a breakdown in a PN junction formed of the $N^+$ type diffusion layer 53 and the $P^+$ type diffusion layer 52. The reverse bias voltage at the breakdown is called a Zener voltage.

The gate insulation film of the MOS transistor is protected by clamping the voltage applied to the gate of the MOS transistor using the Zener diode.

A MOS transistor circuit using the Zener diode is described in Japanese Patent Application Publication No. 2002-84171.

A breakdown voltage of a clamp diode which clamps the voltage applied to the gate of the MOS transistor needs to be set lower than a withstand voltage of the gate insulation film of the MOS transistor. The withstand voltage of the gate insulation film means either an intrinsic breakdown voltage at which a dielectric breakdown of the gate insulation film occurs, or a TDDB (Time Dependent Dielectric Breakdown) voltage (An electric field in the gate oxide is 4 MV/cm.) which takes a change in the withstand voltage over time into consideration. The breakdown voltage of the clamp diode is preferably set lower than the TDDB voltage.

When the gate insulation film is reduced in thickness, the breakdown voltage of the clamp diode needs to be reduced accordingly since the withstand voltage of the gate insulation film is also reduced. On the other hand, the breakdown voltage of the Zener diode is determined in relation to an impurity concentration in the PN junction. Therefore, the breakdown voltage of the Zener diode can be reduced by increasing an impurity concentration in the $P^+$ type diffusion layer 52 or an impurity concentration in the $N^+$ type diffusion layer 53.

When the impurity concentration in the $P^+$ type diffusion layer 52 or the impurity concentration in the $N^+$ type diffusion layer 53 of the conventional Zener diode is increased, however, there is a problem that a leakage current is increased, although the breakdown voltage is reduced.

SUMMARY OF THE INVENTION

The invention provides a semiconductor device that includes a semiconductor layer of a first general conductivity type, a first diffusion layer of a second general conductivity type formed in a surface portion of the semiconductor layer, a second diffusion layer of the first general conductivity type formed in a surface portion of the first diffusion layer, a first electrode connected to the second diffusion layer and a second electrode connected to the semiconductor layer and the first diffusion layer.

The invention also provides a semiconductor device that includes a MOS transistor and a clamp diode having an anode electrode and a cathode electrode. This clamp diode is connected to the gate of the MOS transistor so as to clamp a voltage applied to the gate. The clamp diode includes a semiconductor layer of a first general conductivity type, a first diffusion layer of a second general conductivity type formed in a surface portion of the semiconductor layer and a second diffusion layer of the first general conductivity type formed in a surface portion of the first diffusion layer. The cathode electrode is connected to the second diffusion layer, and the anode electrode is connected to the semiconductor layer and the first diffusion layer.

DETAILED DESCRIPTION OF THE INVENTION

Figure 1:
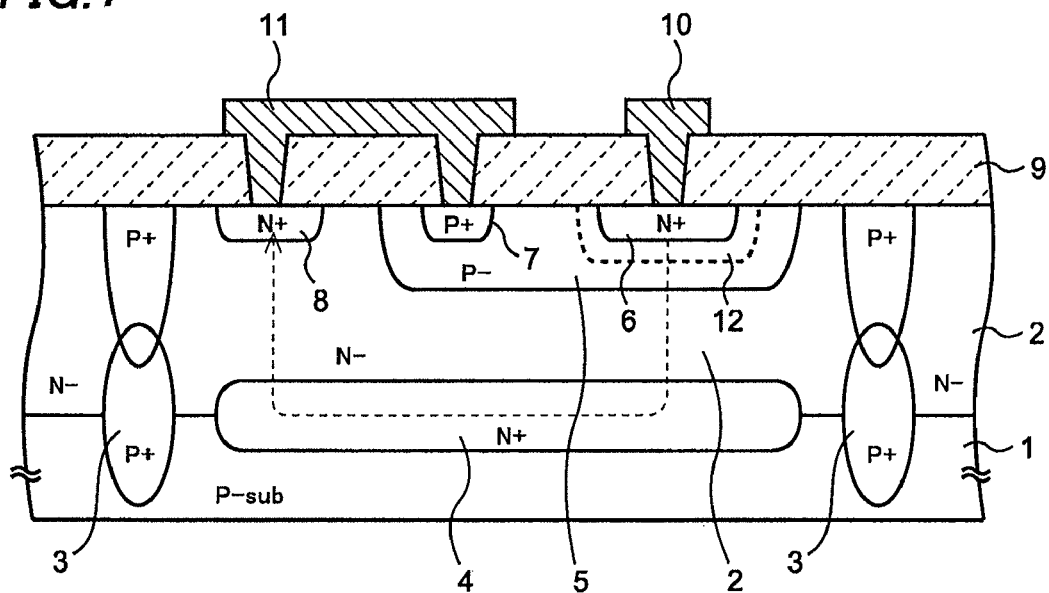
FIG. 1 is a cross-sectional view showing a semiconductor device according an embodiment of this invention.

A semiconductor device according to an embodiment of this invention is hereafter described referring to the drawings. FIG. 1 is a cross-sectional view of the semiconductor device according to the embodiment of this invention. An $N^-$ type semiconductor layer 2 is formed on a P type semiconductor substrate (a silicon substrate, for example) 1 by epitaxial growth.

There is formed a $P^+$ type isolation layer 3 extending from a surface of the $N^-$ type semiconductor layer 2 to the semiconductor substrate 1. The $P^+$ type isolation layer 3 is in a shape of a ring when looked in a direction perpendicular to a surface of the semiconductor substrate 1. A region of the $N^-$ type semiconductor layer 2 surrounded by the $P^+$ type isolation layer 3 makes an electrically isolated island region. The $P^+$ type isolation layer 3 is preferably formed by upward and downward diffusion as shown in the figure in order to reduce an amount of thermal treatment during the diffusion. It is noted that conductivity types such as $N^+$, N and $N^-$ belong in one general conductivity type and conductivity types such as $P^+$, P and $P^-$ belong in another general conductivity type.

It is preferable that an $N^+$ type buried diffusion layer 4 having an impurity concentration higher than that in the $N^-$ type semiconductor layer 2 is formed on a border between the semiconductor substrate 1 and the $N^-$ type semiconductor layer 2 in the island region. The $N^+$ type buried diffusion layer 4 is provided to reduce a resistance of a region in the N⁻ type semiconductor layer 2, and is formed by diffusing N type impurities introduced in the semiconductor substrate 1 upward into the N⁻ type semiconductor layer 2 during the epitaxial growth. With this, a resistance component of the clamp diode in a state of reverse breakdown can be reduced to improve clamping characteristics of the clamp diode.

A P⁻ type diffusion layer 5 is formed in the surface of the N⁻ type semiconductor layer 2 in the island region. An N⁺ type diffusion layer 6 shallower than the P⁻ type diffusion layer 5 is formed in a surface of the P⁻ type diffusion layer 5. The N⁺ type diffusion layer 6 makes a cathode of the clamp diode. In addition, a P⁺ type diffusion layer 7 which is shallower in depth and higher in impurity concentration than the P⁻ type diffusion layer 5 is formed adjacent the N⁺ type diffusion layer 6 in the surface of the P⁻ type diffusion layer 5. The P⁺ type diffusion layer 7 serves to reduce a contact resistance in connecting an electrode to the P⁻ type diffusion layer 5.

An N⁺ type diffusion layer 8 is formed adjacent the P⁻ type diffusion layer 5 in the surface of the N⁻ type semiconductor layer 2. The N⁺ type diffusion layer 8 serves to reduce a contact resistance in connecting an electrode to the N⁻ type semiconductor layer 2.

An insulation film 9 is formed to cover the surface of the N⁻ type semiconductor layer 2. There is formed a cathode electrode 10 of the clamp diode, which is electrically connected with the N⁺ type diffusion layer 6 through a contact hole formed in the insulation film 9 on the N⁺ type diffusion layer 6.

There is formed a wiring 11 connecting between the P⁺ type diffusion layer 7 and the N⁺ type diffusion layer 8 through a contact hole formed in the insulation film 9 on the P⁺ type diffusion layer 7 and a contact hole formed in the insulation film 9 on the N⁺ type diffusion layer 8. The wiring 11 makes an anode electrode of the clamp diode. The N⁻ type semiconductor layer 2 and the P⁻ type diffusion layer 5 are connected with each other through the wiring 11. As a result, an electric potential of the P⁻ type diffusion layer 5 is held at the same electric potential (an anode electric potential) as the N⁻ type semiconductor layer 2, and never becomes unstable.

The insulation film 9 may be made of a LOCOS (Local Oxidation of Silicon) oxide film and an interlayer insulation film of BPSG (Boro-Phospho Silicate Glass) or the like formed on it. In this case, the LOCOS. oxide film is formed above the surface of the N⁻ type semiconductor layer 2 excluding the N⁺ type diffusion layer 6, P⁺ type diffusion layer 7 and the N⁺ type diffusion layer 8, and the contact holes are formed in the interlayer insulation film.

The structure of the clamp diode described above is that of an NPN type vertical bipolar transistor with its collector and base connected together. That is, the N⁺ type diffusion layer 6 corresponds to an emitter, the P⁻ type diffusion layer 5 corresponds to the base and the N⁻ type semiconductor layer 2 corresponds to the collector.

Figure 2:
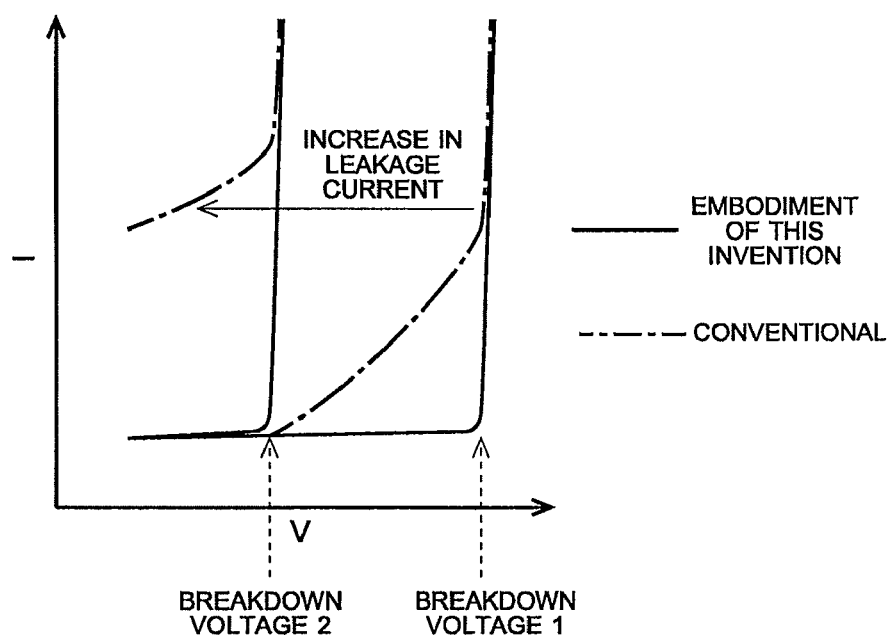
FIG. 2 is a graph showing current-voltage characteristics of a clamp diode.

FIG. 2 shows current-voltage characteristics (I-V curves) of the clamp diode described above and the conventional Zener diode. In FIG. 2, a horizontal axis represents the voltage V, while a vertical axis represents the current I. The voltage shown in FIG. 2 is a reverse bias voltage applied between the cathode electrode 10 and the wiring 11 (the anode electrode) of the clamp diode. The current I flows through the clamp diode, that is, flows from the cathode electrode 10 to the wiring 11 (the anode electrode). The I-V curve of the clamp diode according to the embodiment of this invention is indicated by a solid line, while the I-V curve of the conventional Zener diode is indicated by a chain line.

The leakage current increases when the breakdown voltage of the conventional Zener diode is reduced from a breakdown voltage 1 to a breakdown voltage 2, as shown in FIG. 2. The leakage current means the current flowing under the reverse bias lower than the breakdown voltage. With the clamp diode according to the embodiment of this invention, on the other hand, FIG. 2 shows that the increase in the leakage current is suppressed even when the breakdown voltage is reduced.

The reason will be explained hereafter. Since the impurity concentration in the PN junction is increased in order to reduce the breakdown voltage of the conventional Zener diode, the leakage current is increased as a result of the increase in the impurity concentration. On the other hand, the clamp diode according to the embodiment of this invention utilizes a punch-through caused by that a depletion layer 12 extending from the N⁺ type diffusion layer 6 into the P⁻ type diffusion layer 5 reaches the N⁻ type semiconductor layer 2 below the P⁻ type diffusion layer 5. When the punch-through is caused, the current flows from the N⁻ type semiconductor layer 2 to the N⁺ type diffusion layer 8 through the N⁺ type buried diffusion layer 4 of low resistance (Refer to a dashed line with an arrow shown in FIG. 1.).

The voltage that causes the punch-through defines the breakdown voltage, which is considered to be determined by an impurity concentration and a width of the P⁻ type diffusion layer 5 below the N⁺ type diffusion layer 6. Therefore, the breakdown voltage can be reduced while the impurity concentration in the P⁻ type diffusion layer 5 is suppressed, by reducing the width of the P⁻ type diffusion layer 5 below the N⁺ type diffusion layer 6 to some extent. The leakage current is considered to be suppressed as a result.

Figure 3:
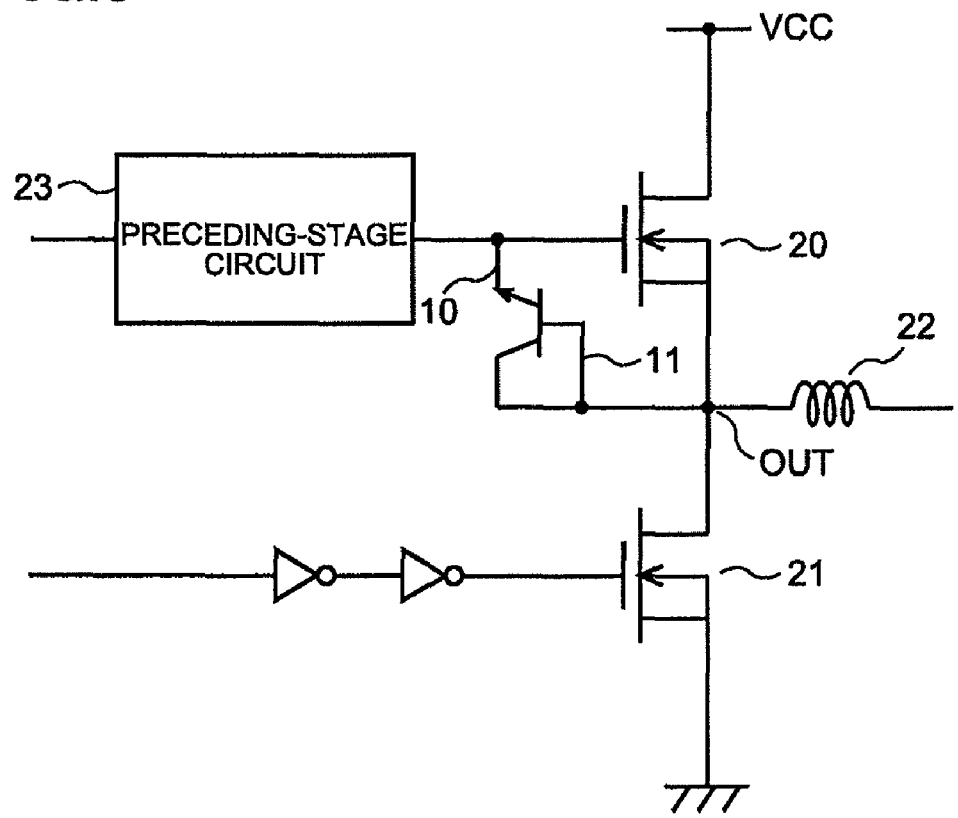
FIG. 3 is a diagram showing an output circuit using the clamp diode according to the embodiment of this invention.
Figure 4:
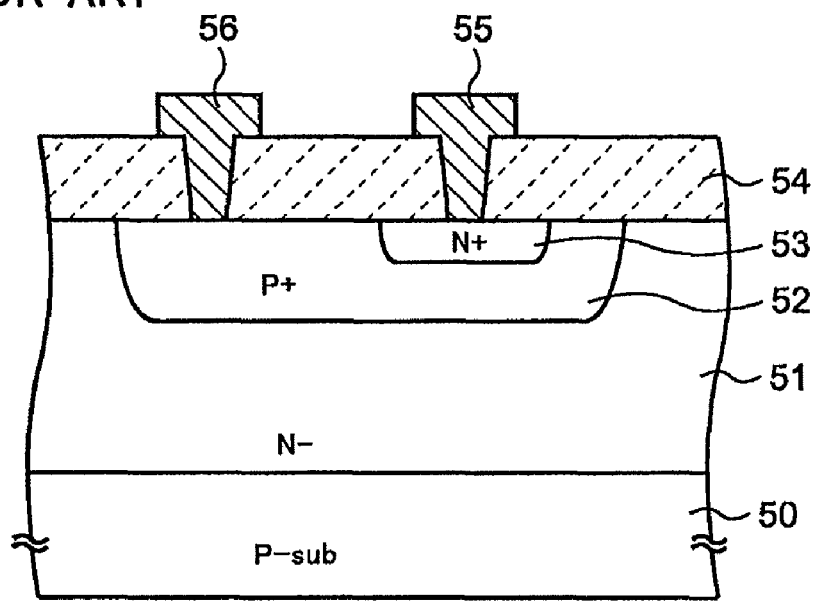
FIG. 4 is a cross-sectional view showing a conventional semiconductor device.

Next, an output circuit using the clamp diode described above will be explained referring to FIG. 3. N-channel type MOS transistors 20 and 21 are connected in series between a power supply and a ground as shown in the figure. A connecting node (a source of the N-channel type MOS transistor 20) between the N-channel type MOS transistors 20 and 21 makes an output terminal OUT, to which a load 22 is connected. The load 22 is a motor, for example. A switching signal from a preceding-stage circuit 23 is applied to a gate of the N-channel type MOS transistor 20.

A power supply voltage VCC is applied to a drain of the N-channel type MOS transistor 20. The N-channel type MOS transistor 20 is turned on when the switching signal is at an H (high) level, while the N-channel type MOS transistor 20 is turned off when the switching signal is at an L (low) level.

If an H level voltage of the switching signal is too high, a gate insulation film of the N-channel type MOS transistor 20 is deteriorated or even destroyed. Thus, the clamp diode described above is connected between the gate and the source of the N-channel type MOS transistor 20 so that the voltage applied between the gate and the source of the N-channel type MOS transistor 20 is clamped. The cathode electrode 10 of the clamp diode according to the embodiment of this invention is connected to the gate and the wiring 11 (the anode electrode) is connected to the source.

Each of the N-channel type MOS transistors 20 and 21 is required to have a low ON resistance so that it can drive the load 22 at a high speed. In order to reduce the ON resistance (that is, to increase a current driving capability) of the N-channel type MOS transistors 20 and 21, the gate insulation film is reduced in thickness. Accordingly, the breakdown voltage of the clamp diode needs to be reduced. For example, when the thickness of the gate insulation is 17 nm, the intrinsic breakdown voltage is 17 V and the TDDB voltage is 7.2 V. When the thickness of the gate insulation film is reduced to 7 nm, the intrinsic breakdown voltage is reduced to 7 V and the TDDB voltage is reduced to 3.6 V In this case, therefore, the breakdown voltage of the clamp diode is required to be lower than 3.6 V. The clamp diode according to the embodiment of this invention is suitable to be used as a gate protection device in the output circuit described above, since its breakdown voltage can be reduced while its leakage current is suppressed.

It is apparent that this invention is not limited to the embodiment described above and may be modified within the scope of the invention. For example, while the structure of the clamp diode is that of the NPN type vertical bipolar transistor with its collector and base connected together in the embodiment described above, it may be replaced with a structure corresponding to a PNP type vertical bipolar transistor with its collector and base connected together by inverting the conductivity types of the diffusion layers.

In the structure mentioned above, the conductivity types of the N⁻ type semiconductor layer 2, the N⁺ type buried diffusion layer 4, the P⁻ type diffusion layer 5, the N⁺ type diffusion layers 6 and 8, and the P⁺ type diffusion layer 7 are inverted. While the clamp diode is used to protect the gate insulation film of the MOS transistor in the output circuit in the embodiment described above, it can be widely used in other clamp circuits in general.

With the clamp diode according to the embodiment of this invention, the breakdown voltage can be reduced while the leakage current is suppressed. Also, when the clamp diode is used as the protection device of the gate insulation film of the MOS transistor, power consumption can be reduced while the breakdown voltage is reduced as the thickness of the gate insulation film is reduced.

What is claimed is:

1. A semiconductor device comprising:
   a semiconductor layer of a first general conductivity type;
   a first diffusion layer of a second general conductivity type formed in a surface portion of the semiconductor layer;
   a second diffusion layer of the first general conductivity type formed in a surface portion of the first diffusion layer;
   a first electrode connected to the second diffusion layer; and
   a second electrode connected to the semiconductor layer and the first diffusion layer;
   wherein the second electrode is connected to the semiconductor layer and the first diffusion layer so that the semiconductor layer and the first diffusion layer are at a same electric potential.

2. The semiconductor device of claim 1, further comprising a semiconductor substrate of the second general conductivity type and a buried diffusion layer of the first general conductivity type, wherein the semiconductor layer is formed on the semiconductor substrate and the buried diffusion layer is formed between the semiconductor layer and the semiconductor substrate.

3. A semiconductor device comprising:
   a MOS transistor; and
   a clamp diode comprising an anode electrode and a cathode electrode, the clamp diode being connected to a gate of the MOS transistor so as to clamp a voltage applied to the gate, the clamp diode comprising a semiconductor layer of a first general conductivity type, a first diffusion layer of a second general conductivity type formed in a surface portion of the semiconductor layer and a second diffusion layer of the first general conductivity type formed in a surface portion of the first diffusion layer, the cathode electrode being connected to the second diffusion layer, and the anode electrode being connected to the semiconductor layer and the first diffusion layer;
   wherein the anode electrode is connected to the semiconductor layer and the first diffusion layer so that the semiconductor layer and the first diffusion layer are at a same electric potential.

4. The semiconductor device of claim 3, the clamp diode further comprising a semiconductor substrate of the second general conductivity type and a buried diffusion layer of the first general conductivity type, wherein the semiconductor layer is formed on the semiconductor substrate and the buried diffusion layer is formed between the semiconductor layer and the semiconductor substrate.

* * * * *